(12) United States Patent
Laporte

(10) Patent No.: US 8,514,979 B2
(45) Date of Patent: Aug. 20, 2013

(54) INTEGRATED DEMODULATOR, FILTER AND DECIMATOR (DFD) FOR A RADIO RECEIVER

(75) Inventor: Pierre-Andre Laporte, Gatineau (CA)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 287 days.

(21) Appl. No.: 12/970,151

(22) Filed: Dec. 16, 2010

(65) Prior Publication Data

US 2012/0155575 A1 Jun. 21, 2012

(51) Int. Cl.
  *H03D 3/00* (2006.01)
(52) U.S. Cl.
  USPC .......................................................... 375/322
(58) Field of Classification Search
  USPC ................. 375/229, 230, 231, 232, 340, 235, 375/344
  See application file for complete search history.

(56) References Cited

U.S. PATENT DOCUMENTS

| | | | | |
|---|---|---|---|---|
| 4,947,408 A | * | 8/1990 | Sadr et al. ...................... | 375/340 |
| 5,732,337 A | * | 3/1998 | Wargnier et al. ............... | 455/144 |
| 5,841,811 A | * | 11/1998 | Song ............................... | 375/235 |
| 2008/0152050 A1 | * | 6/2008 | Watanabe ...................... | 375/344 |

OTHER PUBLICATIONS

Ing-Song Lin et al., Overlapped Block Digital Filtering, IEEE Transactions on Circuits and Systems—II: Analog and Digital Signal Processing, vol. 43, No. 8, Aug. 1996, pp. 586-596.
Ramin Khoini-Poorfard et al., Time-Interleaved Oversampling A/D Converters: Theory and Practice, IEEE Transactions on Circuits and Systems—II: Analog and Digital Signal Processing, vol. 44, No. 8, Aug. 1997, pp. 634-645.
International Search Report and Written opinion mailed Mar. 9, 2012 in corresponding Application No. PCT/IB2011/002879.
International Preliminary Report on Patentability mailed Jan. 3, 2013 in International Application No. PCT/IB2011/002879.

* cited by examiner

*Primary Examiner* — Jaison Joseph
(74) *Attorney, Agent, or Firm* — Nixon & Vanderhye P.C.

(57) ABSTRACT

A superheterodyne receiver includes an A/D converter for converting an IF signal to a stream of samples at a sampling frequency that is four times the IF and a splitter that splits the stream of samples into a first set of even samples and a second set of odd samples. A first quadrature demodulator demodulates just the first set of even samples to produce one of real (I) and imaginary (Q) components of a complex signal at one half of the sampling frequency, and a second, parallel quadrature demodulator demodulates just the second set of odd samples to produce the other of the I and Q components. The demodulated first set is filtered using a first subset of filter coefficients, and the demodulated second set is filtered using a second subset of filter coefficients. The filter outputs correspond to a baseband complex signal. The technology disclosed reduces overall hardware complexity and operating frequency by a factor of two or more.

23 Claims, 10 Drawing Sheets

INTEGRATED DEMODULATOR, FILTER AND DECIMATOR (DFD) FOR A RADIO RECEIVER

TECHNICAL FIELD

The technical field relates to radio communications, and more particularly, to radio receivers.

BACKGROUND

In wireless communications, superheterodyne radio receivers use a mixer to bring the radio frequency (RF) signal down to an intermediate frequency (IF) which can be processed more easily. The IF signal is then demodulated to extract baseband data. When digital demodulation is used in superheterodyne radio receivers, the IF analog signal is converted to digital form using an analog-to-digital converter (ADC) at an ADC sampling rate $f_{adc}$. An advantage of selecting the intermediate frequency (IF) to correspond to $f_{adc}/4$ is that sine and cosine waves used for quadrature demodulation of the ADC output can be represented digitally using only 1, 0, and −1, as shown in the following equations.

$$\cos(2\pi f_{IF} t) = \cos\left(2\pi \frac{f_{adc}}{4} t\right) = \cos\left(2\pi \frac{f_{adc}}{4}(nT_s)\right) =$$
$$\cos\left(\frac{2\pi}{4} \frac{1}{T_s}(nT_s)\right) = \cos\left(\frac{\pi}{2} \times n\right) = \{1, 0, -1, 0, 1, \ldots\}$$

$$\sin(2\pi f_{IF} t) = \sin\left(2\pi \frac{f_{adc}}{4} t\right) = \sin\left(2\pi \frac{f_{adc}}{4}(nT_s)\right) =$$
$$\sin\left(\frac{2\pi}{4} \frac{1}{T_s}(nT_s)\right) = \sin\left(\frac{\pi}{2} \times n\right) = \{0, 1, 0, -1, 0, \ldots\}$$

where:
$f_{adc}$ is the analog-to-digital converter sampling frequency,
$f_{IF}$ is the intermediate frequency ($f_{IF}=f_{adc}/4$),
$T_S$ is the analog-to-digital converter sampling period ($T_S=1/f_{adc}$),
t is the time in the analog domain,
n is the sample index of the sine and cosine waves in the digital domain.

A superheterodyne receiver with its intermediate frequency set to $f_{adc}/4$ requires an extra decimate-by-two function after the digital low-pass filter in order to reduce the sample rate so that the signal spectrum is properly represented using the smallest possible sample rate.

According to the Nyquist sampling theorem, the frequency of the analog-to-digital converter must be chosen so that $f_{adc}/2$ is larger than the bandwidth B of the received signal:

$$\frac{f_{adc}}{2} > B.$$

In some radio communication systems, the received signal bandwidth B can be very large, which may impose a large sample rate $f_{adc}$. Some large sample rates $f_{adc}$ cannot be realized using the existing hardware technologies such ASICs and FPGAs. One approach to address this problem is to duplicate the hardware and operate the two sets of hardware at half the rate in order to achieve the prescribed sample rate. But undesirable tradeoffs with this approach include increased cost, complexity, power consumption, and circuit area. A more optimal approach is desired that allows superheterodyne radio receivers to receive signals with high bandwidths but without one or more of these undesirable tradeoffs or with one or more of these undesirable tradeoffs at least significantly reduced.

SUMMARY

The technology in this application provides such an approach that reduces the processing requirements as well as hardware cost, complexity, power consumption, and circuit area. One aspect of the technology includes a method for use in a radio receiver that comprises the steps of:

translating a received radio frequency (RF) signal to an intermediate frequency (IF) signal;

converting the IF signal to a stream of digital samples using a sampling frequency that is four times the IF;

dividing the stream of digital samples into a first set of even samples and a second set of odd samples;

digitally demodulating the stream of digital samples to produce a complex signal with real (I) and imaginary (Q) components at one half of the sampling frequency using two parallel quadrature demodulators with a first quadrature demodulator demodulating only the first set of even samples and a second quadrature demodulator only demodulating the second set of odd samples; and filtering the demodulated first set of even samples using a first set of coefficients of a digital filter and the demodulated second set of odd samples using a second set of coefficients of the digital filter to produce a baseband complex signal.

Preferably, but not necessarily, the digitally demodulating step only requires one operation per input sample.

In one example embodiment, the filtering produces the baseband complex signal by only filtering the demodulated first set of even samples using a first set of coefficients of a digital filter and the demodulated second set of odd samples using a second set of coefficients of the digital filter.

In another example embodiment, the filtering step implements an N-tap finite impulse response (FIR) filter, where N is a positive integer, using block digital filtering with two parallel filtering paths with one of the filtering paths operating at one half of the sampling frequency on the first set of even samples using even coefficients of the N-tap FIR filter and the other of the filtering paths operating at one half of the sampling frequency on the second set of odd samples using odd coefficients of the N-tap FIR filter. In one example variation of this embodiment, only $N_0$ even coefficients of the N-tap FIR filter are used to filter the first set of even samples and only $N_1$ odd coefficients of the N-tap FIR filter are used to filter the second set of odd samples, where $N_0=N/2$ if N is a even number and $N_0=(N+1)/2$ if N is an odd number and $N_1=N/2$ if N is a even number and $N_1=(N-1)/2$ if N is an odd number. The filtering in one example implementation advantageously only requires N multipliers and N−2 adders, where N is configurable.

In another example embodiment, the method includes delaying one of the first and second set of samples prior to filtering by one time period of the sampling frequency. In an alternative example embodiment, the first set of coefficients of the digital filter correspond to odd coefficients of the digital filter and the second set of coefficients of the digital filter correspond to even coefficients of the digital filter. In this case, no delay is needed.

In yet another example embodiment, the demodulating includes using sine and cosine signals having a frequency corresponding to the sampling frequency divided by four and the baseband complex signal decimation is performed within the filtering step.

Another aspect of the technology includes an apparatus for use in a superheterodyne radio receiver chain. The radio receiver chain includes an analog-to-digital converter for converting an intermediate frequency (IF) signal to a stream of digital samples at a sampling frequency that is four times the IF. The apparatus includes a splitter configured to split the stream of digital samples into a first set of even samples and a second set of odd samples. A first quadrature demodulator is configured to demodulate only the first set of even samples to produce one of real (I) and imaginary (Q) components of a complex signal at one half of the sampling frequency. (The complex signal includes images around one half of the sampling frequency). A second quadrature demodulator is configured to operate in parallel with the first quadrature demodulator to demodulate only the second set of odd samples to produce the other of the I and Q components of the complex signal at one half of the sampling frequency. A first digital filter is configured to filter the demodulated first set of even samples using a first set of coefficients, and a second digital filter is configured to filter the demodulated second set of odd samples using a second set of coefficients. The output of the first and second digital filters corresponds to a baseband complex signal.

Another aspect of this technology is a superheterodyne radio receiver that includes this apparatus.

In an example embodiment, the first digital filter is configured to only filter the demodulated first set of even samples using the first set of coefficients, and the second digital filter is configured to only filter the demodulated second set of odd samples using the second set of coefficients.

In another example embodiment, each of the first and second quadrature demodulators only performs one operation per input sample.

Preferably, but not necessarily, the first and second FIR filters together are configured with only N multipliers and N−2 adders.

In another example embodiment, the first and second filters are finite impulse response (FIR) filters used to implement an N-tap FIR filter, where N is a positive integer. One of the first and second filters is configured to operate at one half of the sampling frequency on the first set of even samples using even coefficients of the N-tap FIR filter, and the other of the first and second filters is configured to operate at one half of the sampling frequency on the second set of odd samples using odd coefficients of the N-tap FIR filter. The first FIR filter may include only about N/2 even coefficients of N-tap FIR filter and the second FIR filter only about N/2 odd coefficients of N-tap FIR filter. N is preferably configurable.

In another example embodiment, one of the first and second FIR filters is includes a delay configured to delay one of the set of samples by one time period of the sampling frequency prior to filtering.

In yet another example embodiment, the first and second FIR filters correspond to first and second phases of a polyphase filter and are configured to filter the first and second sets of even and odd samples at the same time.

The first demodulator is preferably configured to use a cosine signal having a frequency corresponding to the sampling frequency divided by four, and the second demodulator is preferably configured to use a sine signal having a frequency corresponding to the sampling frequency divided by four.

Another aspect of the technology includes an integrated demodulator, filter, and decimator for use in a superheterodyne radio receiver chain like that described above. The integrated demodulator, filter, and decimator consists essentially of:

a first quadrature demodulator configured to demodulate the first set of even samples to produce one of a real (I) and imaginary (Q) components of a complex signal at one half of the sampling frequency;

a second quadrature demodulator configured to operate in parallel with the first quadrature demodulator to demodulate the second set of odd samples to produce the other of the I and Q components of the complex signal at one half of the sampling frequency;

a first digital filter configured to filter the demodulated first set of even samples using a first set of coefficients; and a second digital filter configured to filter the demodulated second set of odd samples using a second set of coefficients, wherein the output of the first and second digital filters corresponds to a baseband complex signal.

Preferably, the integrated demodulator, filter, and decimator is configured to operate at one half of the sampling frequency.

In one example embodiment, the first quadrature demodulator is configured to demodulate only the first set of even samples and the second quadrature demodulator is configured to demodulate only the second set of odd samples. Alternatively or in addition, the first digital filter is configured to only filter the demodulated first set of even samples using the first set of coefficients, and the second digital filter is configured to only filter the demodulated second set of odd samples using the second set of coefficients.

Another aspect of the technology includes a superheterodyne radio receiver including the integrated demodulator, filter, and decimator.

DETAILED DESCRIPTION

Figure 1:
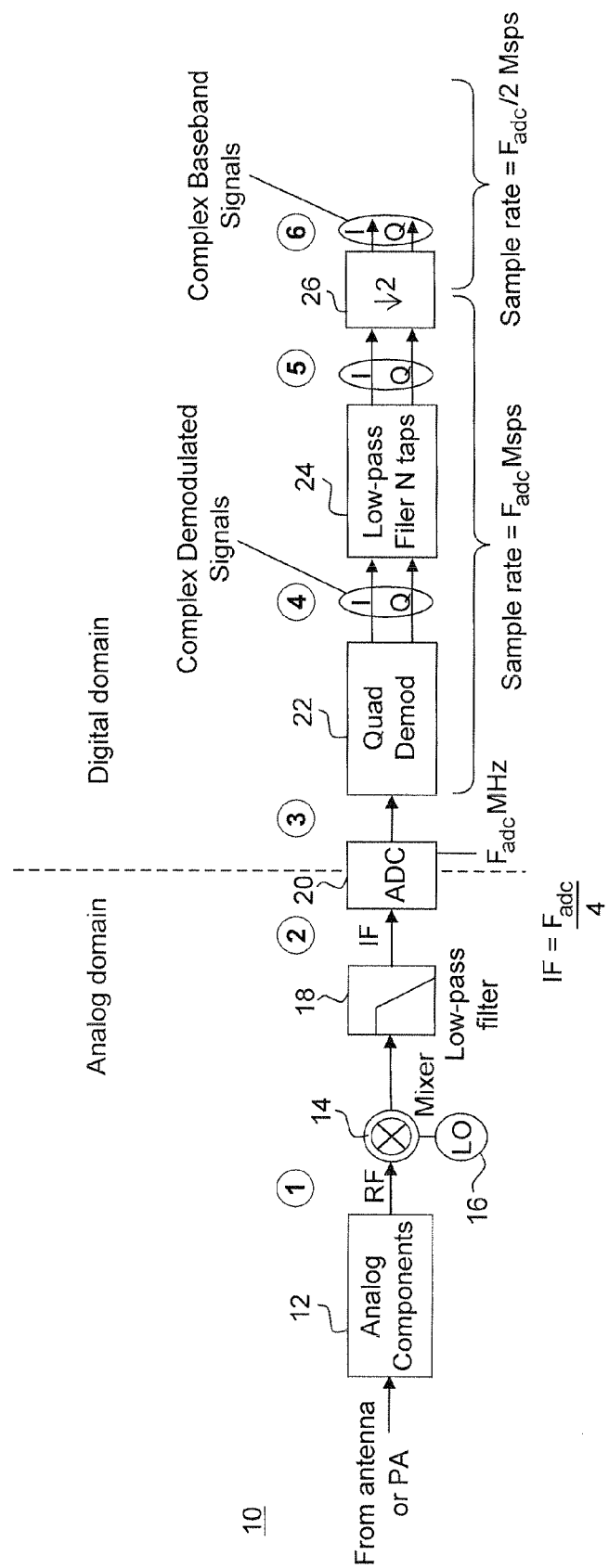
FIG. 1 illustrates a non-limiting example of a superheterodyne receiver with an $f_{IF}=f_{adc}/4$.

In the following description, for purposes of explanation and non-limitation, specific details are set forth, such as particular nodes, functional entities, techniques, protocols, standards, etc. in order to provide an understanding of the described technology. It will be apparent to one skilled in the art that other embodiments may be practiced apart from the specific details disclosed below. In other instances, detailed descriptions of well-known methods, devices, techniques, etc. are omitted so as not to obscure the description with unnecessary detail. Individual function blocks are shown in the figures. Those skilled in the art will appreciate that the functions of those blocks may be implemented using individual hardware circuits, using software programs and data in conjunction with a suitably programmed microprocessor or general purpose computer, using applications specific integrated circuitry (ASIC), and/or using one or more digital signal processors (DSPs). The software program instructions and data may be stored on computer-readable storage medium and when the instructions are executed by a computer or other suitable processor control, the computer or processor performs the functions.

Thus, for example, it will be appreciated by those skilled in the art that diagrams herein can represent conceptual views of illustrative circuitry or other functional units. Similarly, it will be appreciated that any flow charts, state transition diagrams, pseudocode, and the like represent various processes which may be substantially represented in computer readable medium and so executed by a computer or processor, whether or not such computer or processor is explicitly shown.

The functions of the various illustrated elements may be provided through the use of hardware such as circuit hardware and/or hardware capable of executing is software in the form of coded instructions stored on computer-readable medium. Thus, such functions and illustrated functional blocks are to be understood as being either hardware-implemented and/or computer-implemented, and thus machine-implemented.

In terms of hardware implementation, the functional blocks may include or encompass, without limitation, digital signal processor (DSP) hardware, reduced instruction set processor, hardware (e.g., digital or analog) circuitry including but not limited to application specific integrated circuit(s) (ASIC) and/or field programmable gate array(s) (FPGA(s)), and (where appropriate) state machines capable of performing such functions.

In terms of computer implementation, a computer is generally understood to comprise one or more processors or one or more controllers, and the terms computer, processor, and controller may be employed interchangeably. When provided by a computer, processor, or controller, the functions may be provided by a single dedicated computer or processor or controller, by a single shared computer or processor or controller, or by a plurality of individual computers or processors or controllers, some of which may be shared or distributed. Moreover, the term "processor" or "controller" also refers to other hardware capable of performing such functions and/or executing software, such as the example hardware recited above.

Figure 2:
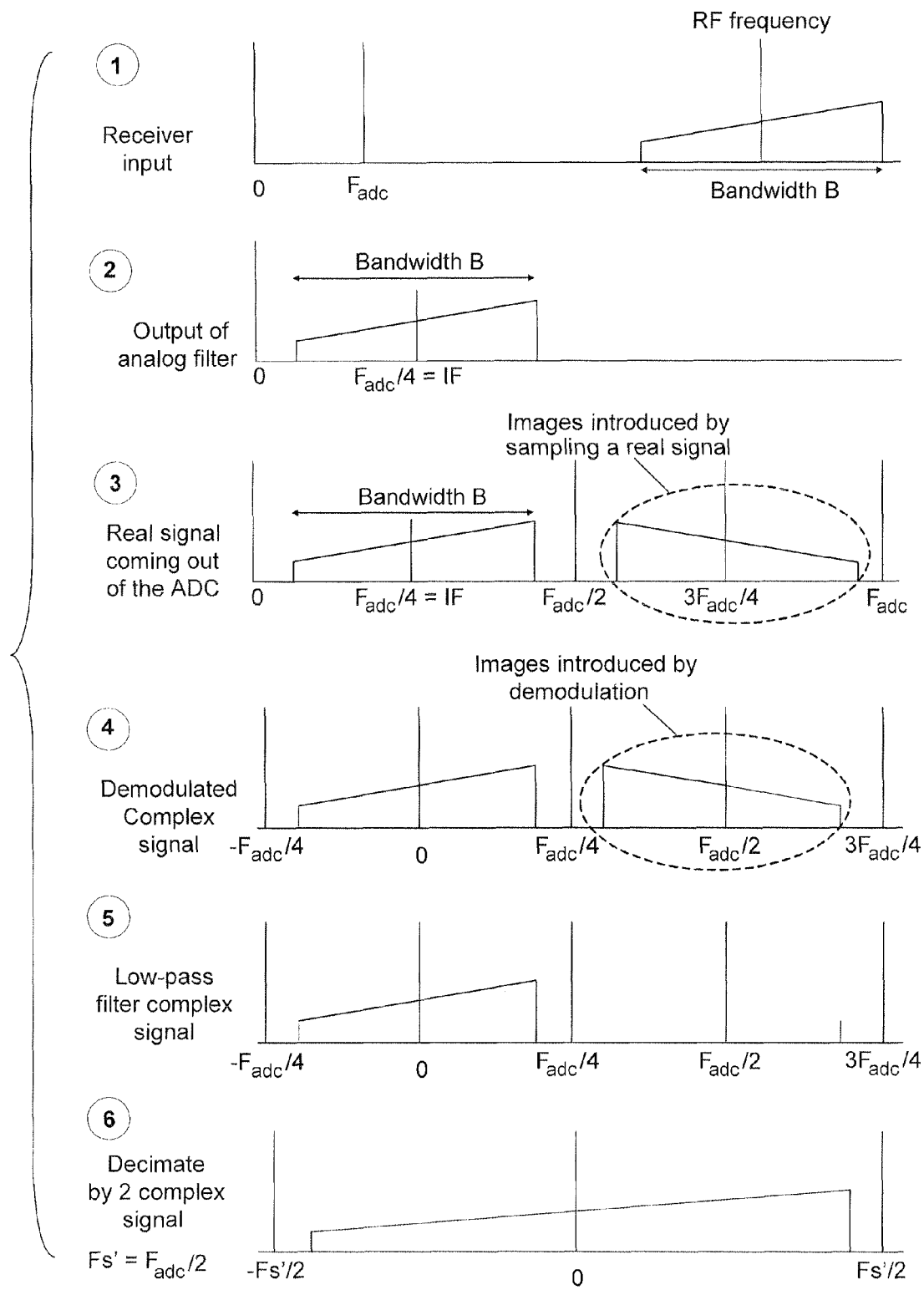
FIG. 2 illustrates the spectrum of a signal at various points in the receiver chain shown in FIG. 1.

FIG. 1 illustrates a non-limiting example of a superheterodyne receiver 10 with an $f_{IF}=f_{adc}/4$ in order to obtain the advantages identified in the background, $f_{IF}$ i.e., so that sine and cosine waves used for quadrature demodulation of the ADC output can be represented digitally using only 1, 0, and −1. FIG. 2 illustrates the spectrum of a signal at various points (1)-(6) identified in the receiver chain 10 shown in FIG. 1. Note that the signal spectrum is non-symmetric about its center frequency.

The input of the receiver 10 can come from either an antenna or from the output of a power amplifier (PA), depending on whether the processing chain is used in a communication receiver or in a feedback receiver for PA linearization. In the case where the processing chain is used in a communication receiver, the analog component(s) 12 includes a low-noise amplifier; otherwise, the analog component(s) 12 includes an attenuator. A mixer 14 receives the output from the analog component is block 12 to bring the radio frequency (RF) signal (see signal (1) in FIG. 2) down to an intermediate frequency (IF) using a local oscillator (LO) 16 signal. The local oscillator frequency (LOF) is chosen so that the spectrum is centered at RF LOF=$f_{adc}/4$ at the output of the mixer. Some unwanted images are also created at a frequency corresponding to RF+LOF. The output of the mixer is filtered in a low-pass filter 18 in order to remove the unwanted images around RF+LOF and extract the IF signal (see signal (2) in FIG. 2) before it is converted into a digital signal by the analog-to-digital converter (ADC) 20 operating at a sampling frequency or rate of $f_{adc}$ (see signal (3) in FIG. 2). In digital hardware, the IF signal is demodulated in a quadrature demodulator 22 using cosine and sine waves of frequency $f_{adc}/4$ MHz to produce real (I) and imaginary (Q) components of a complex signal (see signal (4) in FIG. 2). Then, a digital low pass filter 24 removes the images around $f_{adc}/2$ generated by the demodulation process (see signal (5) in FIG. 2), and a decimator-by-two function/circuit 26 brings the demodulated complex data down to the baseband rate to generate a baseband complex signal (see signal (6) in FIG. 2). This decimation-by-two function/circuit reduces the sample rate so that the signal spectrum is properly represented using the smallest possible sample rate.

As explained in the background, a large received signal bandwidth B imposes a large sample rate $f_{adc}$ that may or may not be suitable for existing digital processing hardware. One approach to address this problem is to duplicate the digital processing hardware and operate the two sets of hardware in parallel at half the rate so that together the prescribed sample rate is achieved. The inventor discovered ways in which duplicated hardware may be used very advantageously.

Figure 3:
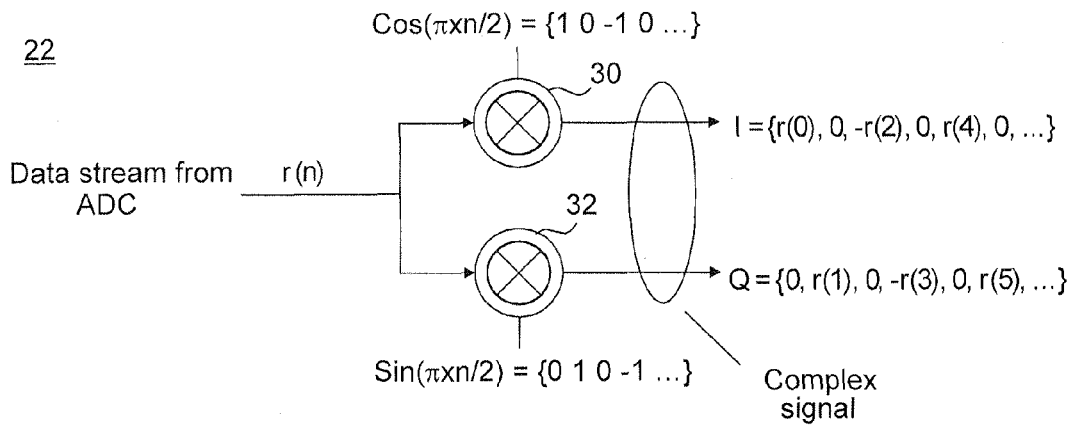
FIG. 3 is a diagram that shows quadrature demodulation using $f_{IF}=f_{adc}/4$.

First, consider duplication of the quadrature demodulator. The demodulator multiplies the incoming sample stream with a sine and a cosine wave at a frequency of $f_{adc}/4$. FIG. 3 is a diagram that shows quadrature demodulation using $f_{IF}=f_{adc}/4$. From a time domain perspective, in order to generate the real sample values (the I's), the incoming data stream is multiplied by the cosine sequence {1 0 −1 0 1 0 −1 0 etc.} from the cosine equation given in the background, which also corresponds to $$\cos\left(\frac{\pi \times n}{2}\right).$$

A key realization made by the inventor is that the odd samples in the real demodulated stream for 1 are all zeros. Similarly, in order to generate the imaginary sample values (the Q's), the incoming data stream is multiplied by the sequence {0 1 0 −1 0 1 0 −1 etc} from the sine equation given in the background, which also corresponds to $$\sin\left(\frac{\pi \times n}{2}\right).$$

The inventor further realized that all the even samples in the demodulated stream for Q are zeros. These two realizations form the basis for simplifying the duplicated hardware which is now explained in a step-by-step process towards achieving a more optimal configuration.

Figure 4:
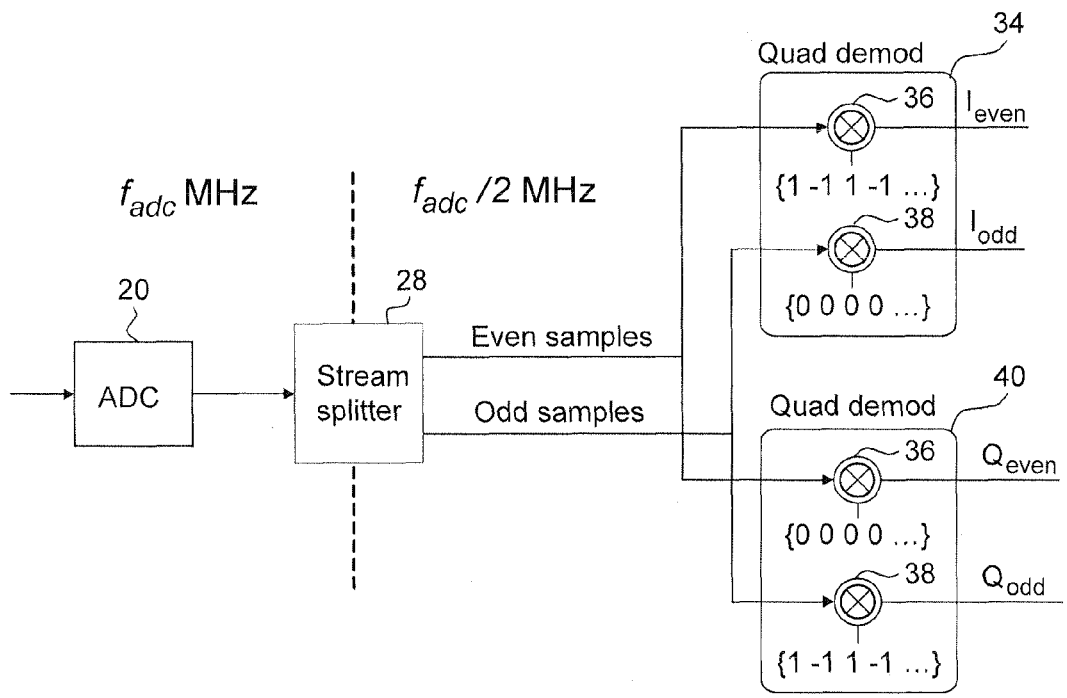
FIG. 4 is a diagram that shows quadrature demodulation using $f_{IF}=f_{adc}/4$ with duplicated quadrature demodulators.

When hardware duplication is used to achieve a given sample rate, the quadrature demodulation process can be implemented using a duplicate quadrature demodulator similar to that presented in FIG. 4. A stream splitter 28 divides the ADC output stream of digital samples into even and odd sample streams at one half of the ADC rate, i.e., $f_{adc}/2$. A first quadrature demodulator 34 includes an even multiplier 36 for multiplying the even stream by the alternating sequence 1 −1 1 −1 and an odd multiplier 38 for multiplying the odd stream by a sequence of 0's because of the special properties of using $f_{IF}=f_{adc}/4$. A second quadrature demodulator 40 includes an even multiplier 36 for multiplying the even stream by a sequence of 0's and an odd multiplier 38 for multiplying the odd stream by the alternating sequence 1 −1 1 −1, again because of the special properties of using $f_{IF}=f_{adc}/4$. Actual hardware multipliers are not required to perform these operations. Instead, the $I_{even}$ stream may be generated by negating one of every two samples of the even samples stream, and the $I_{odd}$ stream may be generated by zeroing the odd samples stream. Similarly, the $Q_{even}$ stream may be generated by zeroing the even samples stream and the $Q_{odd}$ stream by negating one of every two samples of the odd samples stream.

Next, the digital filtering 24 is addressed. A Finite Impulse Response (FIR) filter can be implemented using M times the hardware at a 1/M rate using a technique called block digital filtering. Two references explain this technique and provide non-limiting examples of filter implementations: (1) Ing-Song Lin, Sanjit K. Mitra, "Overlapped Block Digital Filtering," IEEE Transactions on Circuits and Systems—II: Analog and Digital Signal Processing, Vol. 43, No. 8, August 1996, pp. 586-596 and (2) Ramin Khoini-Poorfard; Lysander B. Lim; David A. Johns, "Time-Interleaved Oversampling A/D Converters: Theory and Practice," IEEE Transactions on Circuits and Systems—II: Analog and Digital Signal Processing, Vol. 44, No. 8, August 1997, pp. 634-645. These references are incorporated here by reference.

A FIR filter implements the convolution described by the following equation:

$$y(m) = \sum_{n=0}^{N-1} h(n)x(m-n), m \in [0 : L_x - 1],$$

where:
y is the filter output stream,
x is the filter input stream,
m is the sample index for both the input and output streams,
h is the filter impulse response, i.e., the filter coefficients,
n is the filter tap index,
N is the total number of taps in the FIR,
$L_x$ is the length of the input stream in samples.

For the case where M=2, the convolution performed by the FIR filter can be re-written as follows using variable substitutions, where the first equation represents the calculations for the even output samples, and the second equation represents the calculations for the odd output samples.

$$y_{even}(k) = y(2k) = \sum_{n=0}^{N-1} h(n)x(2k-n), k \in \left[0 : \frac{L_x}{2} - 1\right],$$

$$y_{odd}(k) = y(2k-1) = \sum_{n=0}^{N-1} h(n)x((2k-1)-n), k \in \left[0 : \frac{L_x}{2} - 1\right].$$

The above convolutions can be further expanded by introducing one summation for the even coefficients ($h(2n_0)$) and another summation for the odd coefficients ($h(2n_1+1)$):

$$y_{even}(k) =$$
$$y(2k) = \sum_{n_0=0}^{N_0-1} h(2n_0)x(2k - 2n_0) + \sum_{n_1=0}^{N_1-1} h(2n_1+1)x(2k - (2n_1+1)),$$

$$y_{odd}(k) = y(2k-1) =$$
$$\sum_{n_0=0}^{N_0-1} h(2n_0)x(2k - 1 - (2n_0)) + \sum_{n_1=0}^{N_1-1} h(2n+1)x(2k - 1 - (2n_1+1)).$$

Note that $N_0=N_1=N/2$ when N is an even number. In the case where N is an odd number, $N_0=(N+1)/2$ and $N_1=(N-1)/2$.

By re-organizing the terms, the above equations can be re-written as follows:

$$y_{even}(k) =$$
$$y(2k) = \sum_{n_0=0}^{N_0-1} h(2n_0)x(2(k-n_0)) + \sum_{n_1=0}^{N_1-1} h(2n_1+1)x(2(k-n_1)-1),$$

$$y_{odd}(k) = y(2k-1) =$$
$$\sum_{n_0=0}^{N_0-1} h(2n_0)x(2(k-n_0)-1) + \sum_{n_1=0}^{N_1-1} h(2n_1+1)x(2(k-n_1-1)).$$

Because that the terms ($k-n_0$) and ($k-n_1-1$) of the above equations are integer values, the expressions $2\times(k-n_0)$ and $2\times(k-n_1-1)$ will always equal even values. Similarly, the expressions $2\times(k-n_1)-1$ and $2\times(k-n_0)-1$ of the above equations will always equal odd values. Thus, the following associations may be made:

$h(2n_0)$: Even coefficients (Phase 0),
$h(2n_1+1)$: Odd coefficients (Phase 1),
$x(2(k-n_0))$: Even input samples,
$x(2(k-n_1)-1)$: Odd input samples,
$x(2(k-n_0)-1)$: Odd input samples,
$x(2(k-n_1-1))$: Even input samples delayed by one sample.

On initial startup, when k=0, the above equations require a value for x(−1) which does not exist. In order to satisfy this requirement, the odd input sample stream is delayed by an extra clock cycle at the input of the filter so that x(−1)=0. Similarly, the first output sample of the $y_{odd}$ filter will always correspond to y(−1)=0.

The FIR filter 24 includes a shift register 50 that effectively introduces a series of delays ($Z^{-1}$) 56 for the input data sample as the sample is clocked through the register. The FIR filter is an N-tap filter, where N is a positive integer, so the shifter register includes N−1 delays 56. The input sample and each delayed output sample are sent to a corresponding multiplier 52 and multiplied by a corresponding filter coefficient, tap, or weight h(n), where n is an integer that corresponds to the register index, and n is in the range of [0:N−1]. The outputs of all of N multipliers 52 are summed in summers 54 to generate a filtered output.

Based on the block filtering technique described above, the FIR filter 24 may be implemented as a polyphase filter 25 where P0 and P1 stand for Phase 0 and Phase 1. Phase 0 comprises the even filter coefficients of the filter impulse response, and Phase 1 comprises the odd filter coefficients of the filter impulse response. In the situation where the original FIR filter 24 has N filter coefficients, the P0 and P1 filters may be implemented as smaller FIR filters 58 and 59 with N/2 coefficients. If N is an odd number, then the filter P0 includes (N+1)/2 coefficients and the filter P1 includes (N−1)/2 coefficients. A delay 56 is included for all odd input data and for even input data fed to filter P1 59 in the odd data branch. Respective summers 60 sum the P0 (58) and P1 (59) filter outputs for the even and odd data branches to generate even data output and odd data output.

Figure 5:
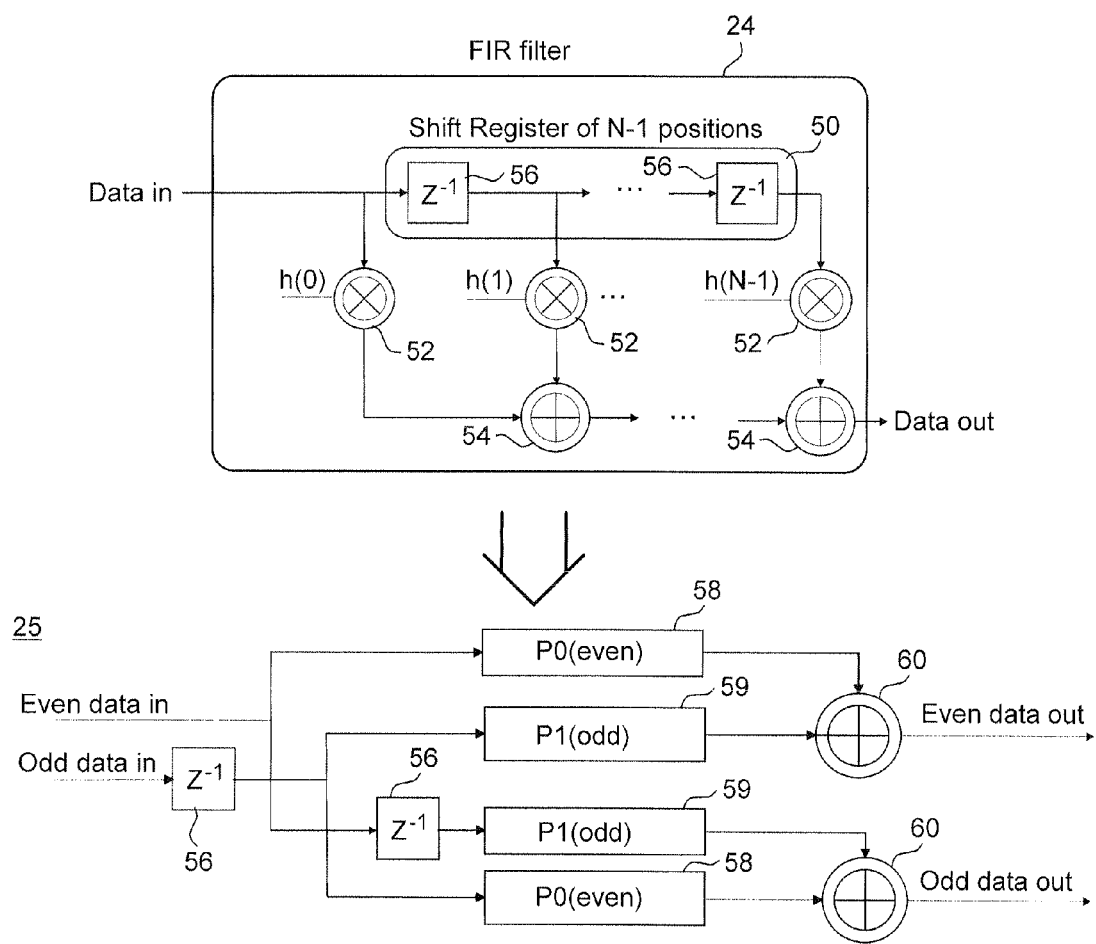
FIG. 5 illustrates a non-limiting example of a digital FIR filter for use in the superheterodyne receiver shown in FIG. 1.
Figure 6:
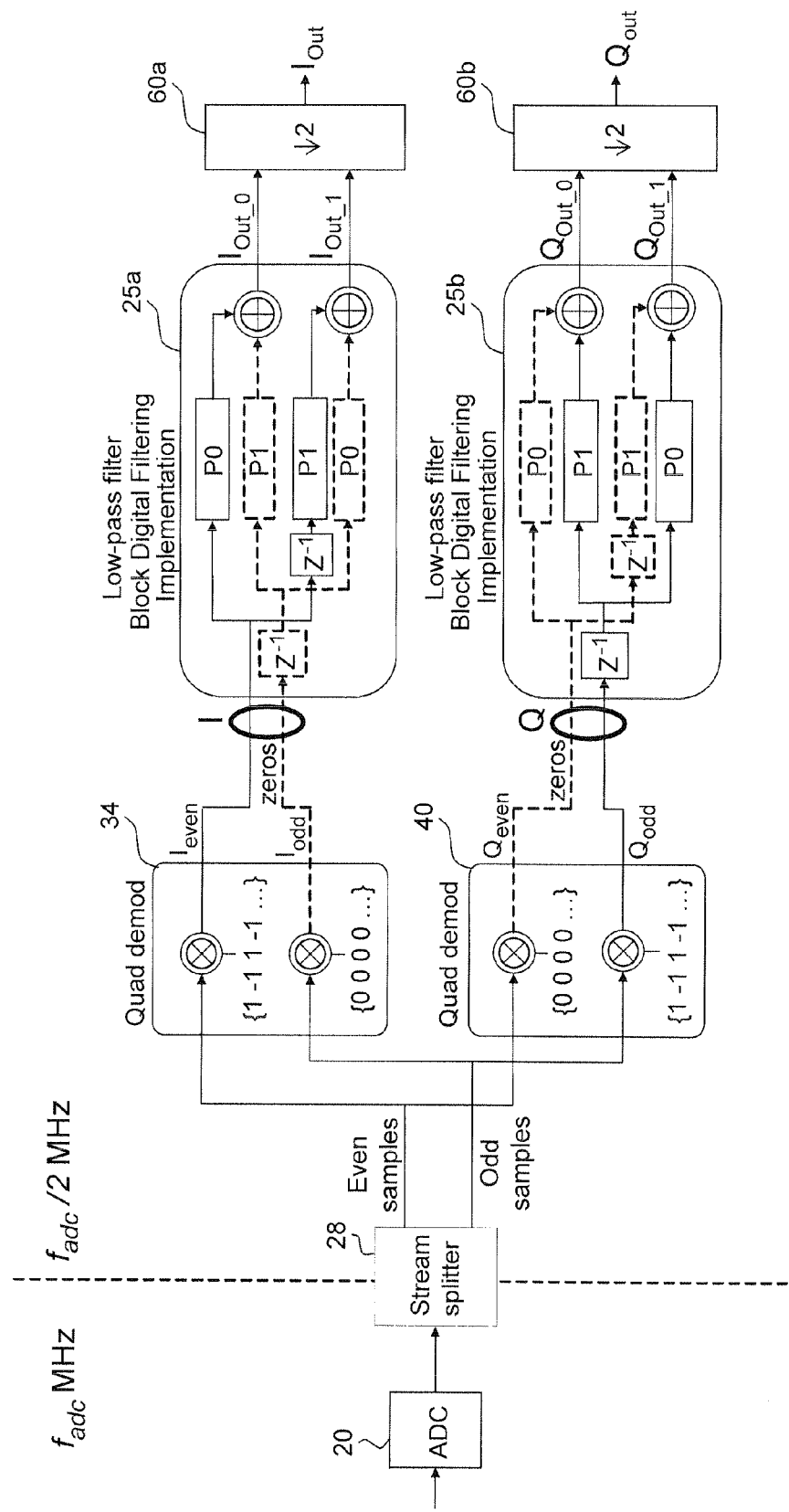
FIG. 6 is a non-limiting example diagram of a digital demodulation, filtering, and decimation (DFD) portion of the superheterodyne receiver at half the rate using twice the hardware.

Based on the two realizations made by the inventor with respect to simplifying quadrature demodulation for a duplicated hardware implementation, digital demodulation, filtering, and decimation section of the superheterodyne receiver can be represented as shown in FIG. 6, i.e., combining elements from FIGS. 4 and 5. In FIG. 6, all the dotted lines represent streams of zeros. Consequently, the inventor further recognized that all of the dotted line functions only process zeros, and as a result, they could be removed to improve on the FIG. 6 implementation.

Figure 7:
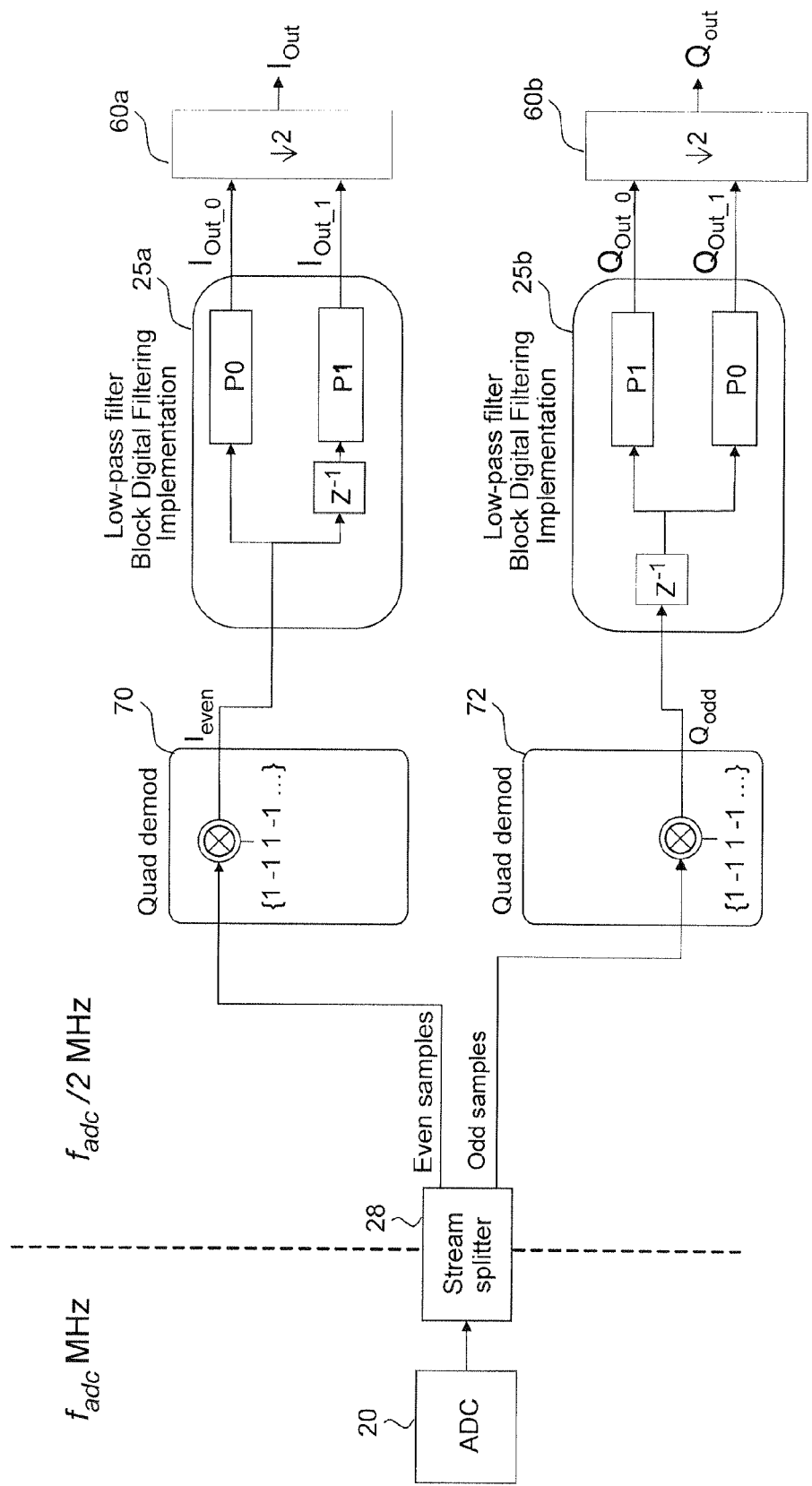
FIG. 7 is a non-limiting example diagram of a digital demodulation, filtering, and decimation (DFD) portion of the superheterodyne receiver at half the rate with a first amount of data processing optimization.

FIG. 7 is a non-limiting example diagram of a digital demodulation, filtering, and decimation (DFD) portion of the superheterodyne receiver at half the rate with this first amount of data processing improvement. With the zero processing removed, the quadrature demodulator 70 demodulates only the even samples, the quadrature demodulator 72 demodulates only the odd samples, the block digital filter 25*a* low-pass filters only the $I_{even}$ demodulated samples using one P0 phase filter and one delay/P1 phase filter, and the block digital filter 25*b* low-pass filters only the $Q_{odd}$ demodulated samples delayed by one delay using one P0 phase filter and one P1 phase filter. Filter 25*a* outputs two streams to decimator 60*a*: $I_{out\_0}$ and $I_{out\_1}$. Filter 25*b* outputs two streams to decimator 60*b*: $Q_{out\_0}$ and $Q_{out\_1}$.

Figure 8:
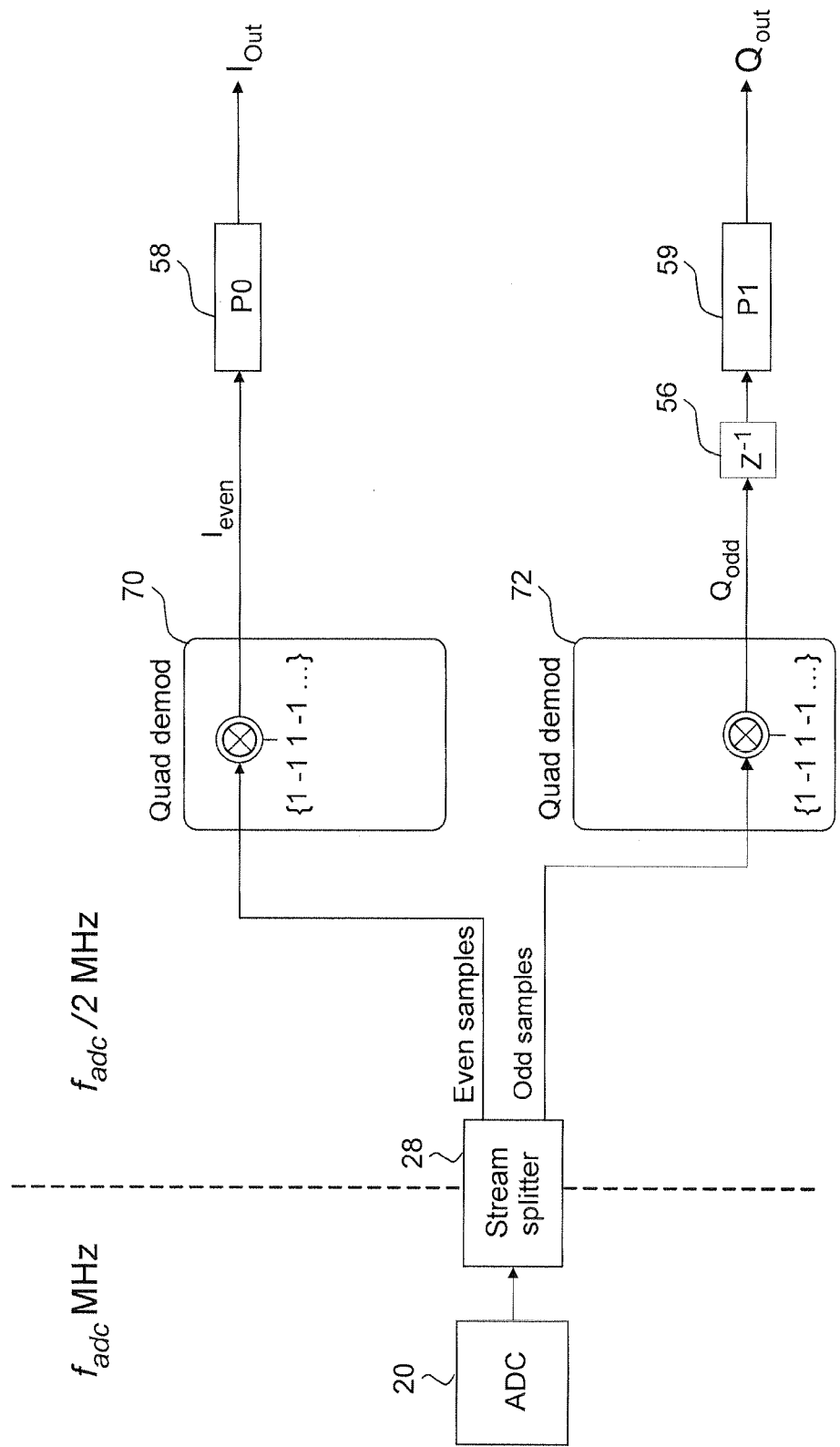
FIG. 8 is a non-limiting example diagram of a digital demodulation, filtering, and decimation (DFD) portion of the superheterodyne receiver at half the rate with a second further amount of data processing optimization.

FIG. 8 is a non-limiting example diagram of a digital demodulation, filtering, and decimation (DFD) portion of the superheterodyne receiver at half the rate is with a second further amount of data processing improvement. At the outputs of the block digital filters 25*a* and 25*b* of FIG. 7, the aggregated sample rate corresponds to $2 \times f_{adc}/2$ samples per second. The role of the decimation-by-two function is to bring this aggregated sample rate to $f_{adc}/2$ samples per second. In other words, the decimation-by-two blocks 60*a* and 60*b* each select one of every two samples and discard the other sample. An alternative to this approach that eliminates the need for the decimators 60*a*, 60*b* is to eliminate one branch inside the block digital filters 25*a* and 25*b* of FIG. 7, so that the filter output sample rates are already at $f_{adc}/2$ samples per second, with the further benefit that the filter complexity is further reduced by half. Either output pair ($I_{out0}$, $Q_{out0}$) or ($I_{out1}$, $Q_{out1}$) may be selected.

The example implementation in FIG. 8 uses $I_{out\_0}$ and $Q_{out\_0}$ (see FIG. 7) so that the $Q_{odd}$ stream is delayed by delay 56. Alternatively, $I_{out\_1}$ and $Q_{out\_1}$ may be selected so that the even set of filter coefficients filter the odd data stream and the odd set of coefficients filter the even data stream. In this alternative implementation, delay is needed in both branches before the polyphase filters (P1 and P0) as can be seen in FIG. 7. Since both data streams $I_{out\_1}$ and $Q_{out\_1}$ go through a corresponding delay element, those delay elements can be removed without affecting performance further simplifying the hardware and/or processing.

Figure 9:
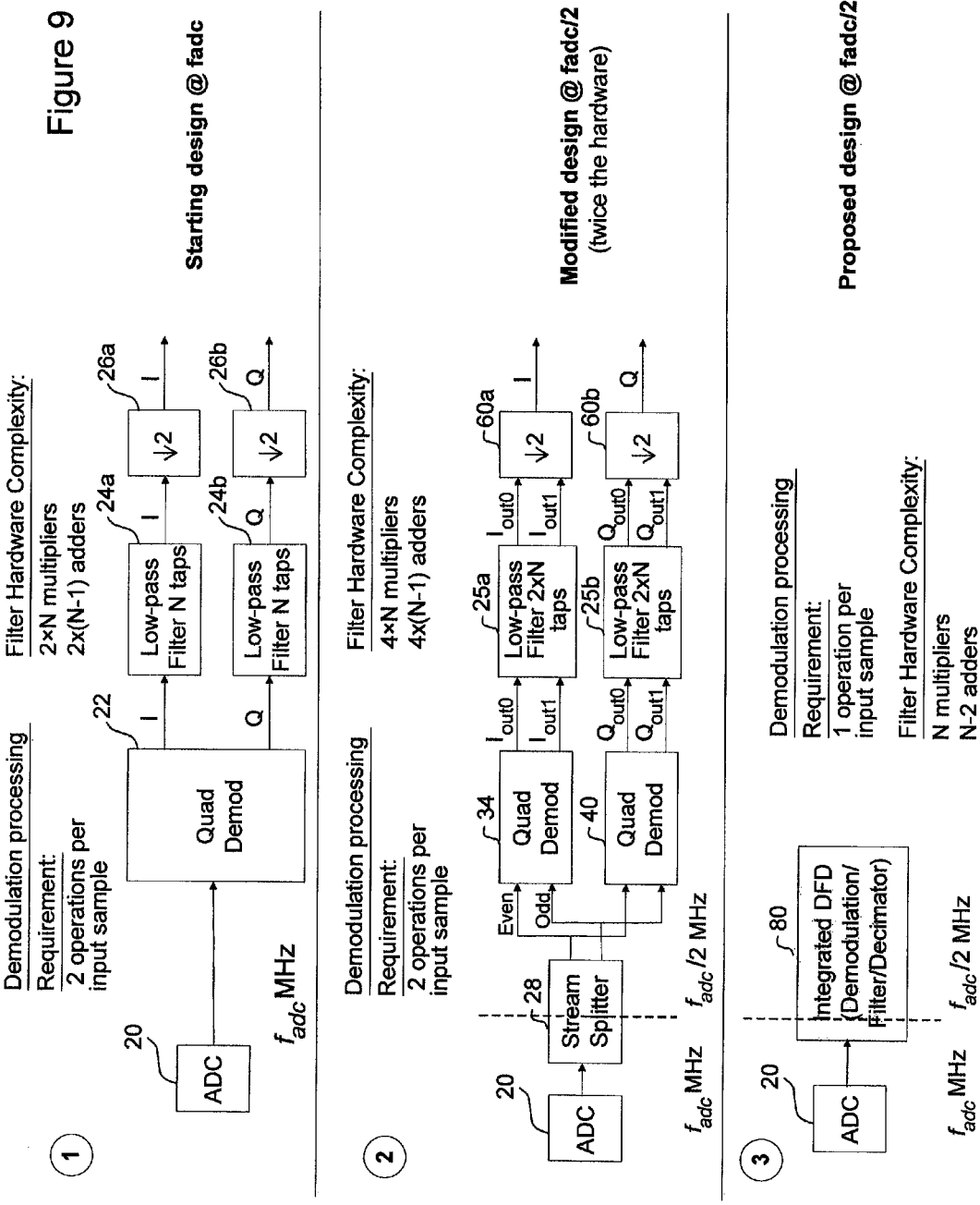
FIG. 9 includes non-limiting example diagrams that show different amounts of data processing complexity for different implementations of the demodulation, filtering, and decimation (DFD) portion for a superheterodyne receiver.

The reduction in hardware and processing achieved using the technology described in this application is substantial. FIG. 9 helps to illustrate this reduction with non-limiting example diagrams that show different amounts of data processing complexity for different implementations of the demodulation, filtering, and decimation (DFD) portion of a superheterodyne receiver. Diagram (1) represents a quadrature demodulator, low-pass digital filter, decimator-by-two digital processing portion where the ADC sampling rate is not reduced, e.g., $f_{adc}$. The demodulation processing for (1) requires two operations per input sample, and the filtering requires 2×N multipliers and 2×(N−1) adders. But for situations where that ADC sampling rate is too high, e.g., a large received signal bandwidth, the processing rate may be cut in half ($f_{adc}/2$) resulting in a duplicated hardware implementation in diagram (2). The demodulation processing for (2) requires two operations per input sample and the filtering requires 4×N multipliers and 4×(N−1) adders. Note the significant improvement in diagram (3) which shows the integrated demodulator, filter, decimator (DFD) (the decimation process has been propagated into the filter as explained above) 80 operates at one half of the ADC sampling rate but only requires one operation per input sample for demodulation processing as well as N multipliers and (N−2) adders for filtering and decimation.

In other words, the overall hardware complexity and the operating frequency in implementation (3) operating at $f_{adc}/2$ are reduced by a factor of two as compared to the implementation (1) operating at $f_{adc}$ and even more so as compared to implementation (2) operating at $f_{adc}/2$. The result also provides significant cost, circuit area, and power savings. The fact that the integrated DFD can operate at half of the ADC sampling rate allows the hardware to support larger signal bandwidths without trading off power consumption and circuit area. This technology also results in simpler hardware for processing smaller bandwidths.

Figure 10:
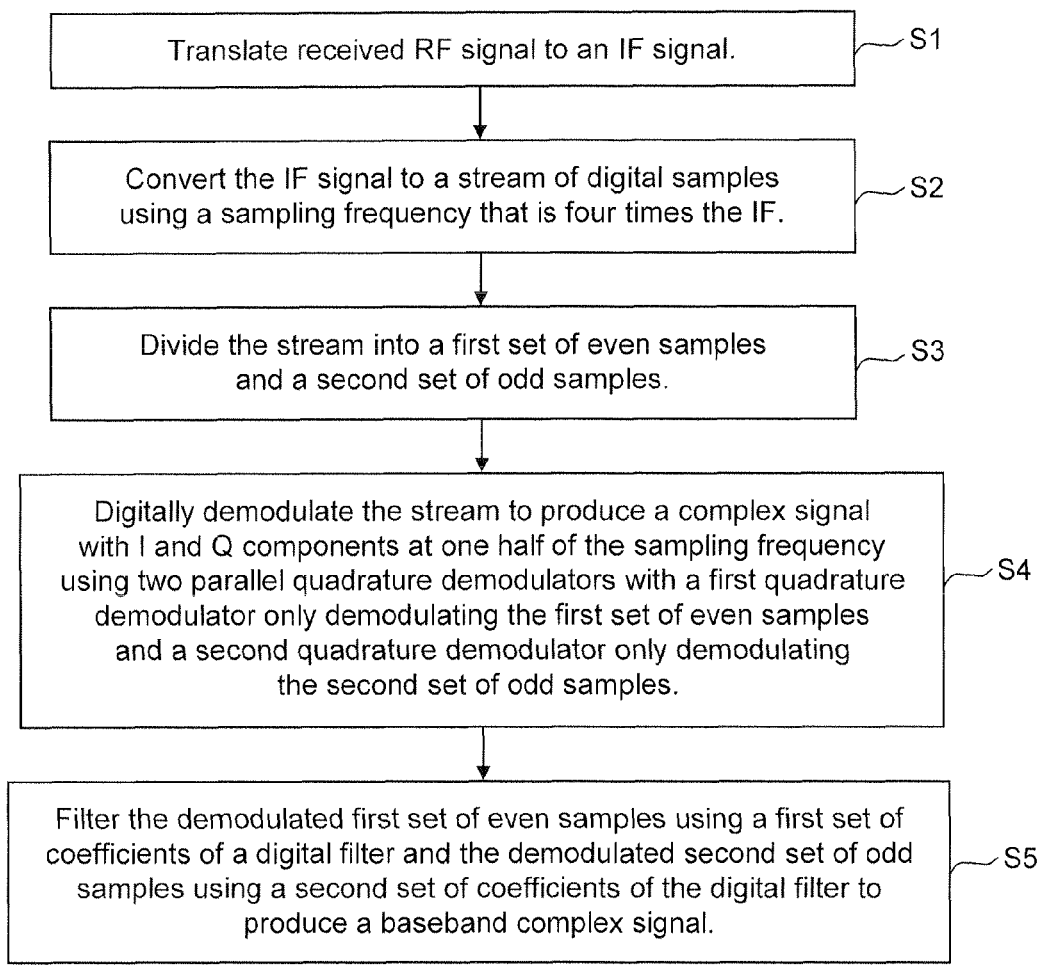
FIG. 10 illustrates a flowchart diagram with non-limiting example procedures for processing a received signal in a superheterodyne receiver that uses the digital demodulation, filtering, and decimation (DFD) portion of FIG. 8.

FIG. 10 illustrates a flowchart diagram with non-limiting example procedures for processing a received signal in a superheterodyne receiver that uses the digital demodulation, filtering, and decimation (DFD) portion of FIG. 8. A received radio frequency (RF) signal is translated to an intermediate frequency (IF) signal (step S1), and the IF signal is converted to a stream of digital samples using a sampling frequency that is four times the IF (step S2). The stream of digital samples is divided into a first set of even samples and a second set of odd samples (step S3). The stream of digital samples is then digitally demodulated to produce a complex signal with real (I) and imaginary (Q) components at one half of the sampling frequency using two parallel quadrature demodulators with a first quadrature demodulator demodulating only the first set of even samples and a second quadrature demodulator only demodulating the second set of odd samples (step S4). The demodulated first set of even samples is filtered using a first set of coefficients of a digital filter and the demodulated second set of odd samples using a second set of coefficients of the digital filter to produce a baseband complex signal (step S5).

Figure 11:
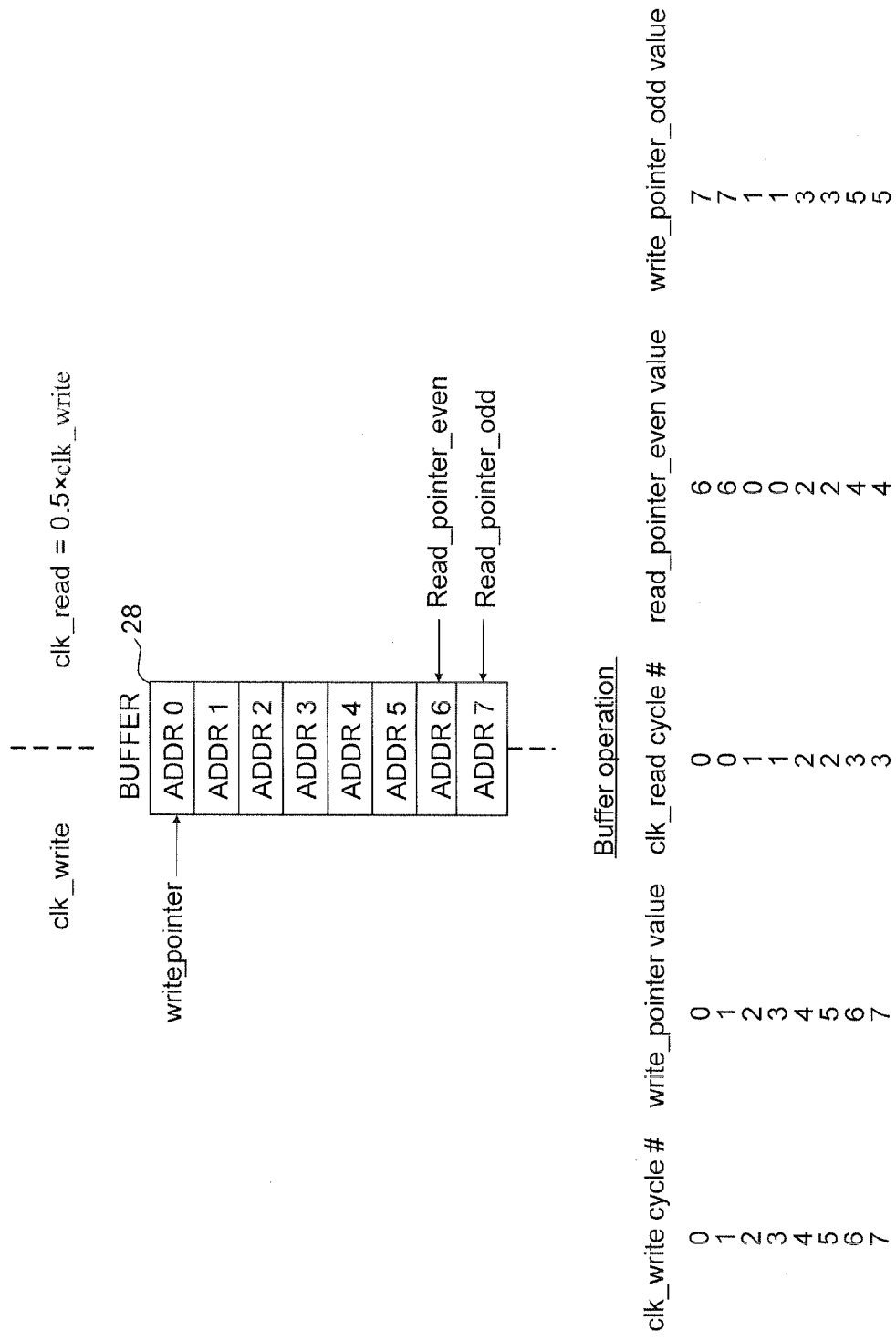
FIG. 11 is a non-limiting, example implementation that may be used for the splitter used in the digital demodulation, filtering, and decimation (DFD) portion of FIG. 8.

FIG. 11 is a non-limiting, example implementation that may be used for the splitter 28 used in the digital demodulation, filtering, and decimation (DFD) portion of FIG. 8. The stream splitter 28 is implemented in this example as a buffer with a write pointer Write_pointer operating at twice the clock speed of two read pointers: Read_pointer_even and Read_pointer_odd. The write pointer stores the ADC samples into buffer memory, and the two read pointers start at an offset address from each other. In the example in FIG. 11, the offset is 1. Each read pointer advances by two addresses at each (half rate) clock tick. The table at the bottom of FIG. 11 shows an example of the buffer and pointer operations over multiple read and write clock cycles. This buffer implementation is just an example, and those skilled in the art will appreciate that any suitable stream splitting operation may be performed including splitting operations that do not use a buffer.

There are multiple advantages provided by this technology including, for example, reduced computing requirements on demodulation and filtering in general, compact and optimized implementation, filter complexity specifically reduced by four compared to the implementation (2) of FIG. 9 at $f_{adc}/2$ or reduced by two compared to the implementation (1) of FIG. 9 at $f_{adc}$, and lower sample rates making for easier hardware implementation and enabling power savings during operation. A smaller number of taps per filter may be used (N/2 instead of N), so that internal bit width remains smaller through the adder chain inside the phase 0 and phase 1 filters. Therefore, loss of precision due to rounding and truncation is reduced. The integrated DFD may be also used to advantage even when the initial sample rate ($f_{adc}$) is achievable using the existing technologies.

Although various embodiments have been shown and described in detail, the claims are not limited to any particular embodiment or example. None of the above description should be read as implying that any particular element, step, range, or function is essential such that it must be included in the claims scope. The scope of patented subject matter is defined only by the claims. The extent of legal protection is defined by the words recited in the allowed claims and their equivalents. All structural and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the technology described, for it to be encompassed by the present claims. No claim is intended to invoke paragraph 6 of 35 USC §112 unless the words "means for" or "step for" are used. Furthermore, no embodiment, feature, component, or step in this specification is intended to be dedicated to the public regardless of whether the embodiment, feature, component, or step is recited in the claims.

The invention claimed is:

1. A method for use in a radio receiver, comprising the steps of:
   translating a received radio frequency (RF) signal to an intermediate frequency (IF) signal;
   converting the IF signal to a stream of digital samples using a sampling frequency that is four times the IF;
   dividing the stream of digital samples into a first set of even samples and a second set of odd samples;
   digitally demodulating the stream of digital samples to produce a complex signal with real (I) and imaginary (Q) components at one half of the sampling frequency using two parallel quadrature demodulators with a first quadrature demodulator demodulating only the first set of even samples and a second quadrature demodulator only demodulating the second set of odd samples;
   delaying the second set of odd samples by one time period of the sampling frequency; and
   filtering the demodulated first set of even samples using a first set of coefficients of a digital filter and the delayed demodulated second set of odd samples using a second set of coefficients of the digital filter to produce a baseband complex signal, the filtering implementing an N-tap finite impulse response (FIR) filter, where N is a positive integer, using block digital filtering with two parallel filtering paths with one of the filtering paths operating at one half of the sampling frequency on the first set of even samples using even coefficients of the N-tap FIR filter and the other of the filtering paths operating at one half of the sampling frequency on the second set of odd samples using odd coefficients of the N-tap FIR filter.

2. The method in claim 1, wherein the filtering produces the baseband complex signal by only filtering the demodulated first set of even samples using a first set of coefficients of a digital filter and the demodulated second set of odd samples using a second set of coefficients of the digital filter.

3. The method in claim 1, wherein the digitally demodulating step only requires one operation per input sample.

4. The method in claim 1, further comprising using only $N_0$ even coefficients of the N-tap FIR filter to filter the first set of even samples and only $N_1$ odd coefficients of the N-tap FIR filter to filter the second set of odd samples, where $N_0=N/2$ if N is a even number and $N_0=(N+1)/2$ if N is an odd number and $N_1=N/2$ if N is a even number and $N_1=(N-1)/2$ if N is an odd number.

5. The method in claim 1, wherein the filtering only requires N multipliers and N−2 adders.

6. The method in claim 1, wherein N is configurable.

7. The method in claim 1, wherein the demodulating includes using sine and cosine signals having a frequency corresponding to the sampling frequency divided by four.

8. The method in claim 1, further comprising performing baseband complex signal decimation within the filtering step.

9. Apparatus for use in a superheterodyne radio receiver chain, where the radio receiver chain includes an analog-to-digital converter for converting an intermediate frequency (IF) signal to a stream of digital samples at a sampling frequency that is four times the IF, the apparatus comprising:
   a splitter configured to split the stream of digital samples into a first set of even samples and a second set of odd samples;
   a first quadrature demodulator configured to demodulate only the first set of even samples to produce one of real (I) and imaginary (Q) components of a complex signal at one half of the sampling frequency;
   a second quadrature demodulator configured to operate in parallel with the first quadrature demodulator to demodulate only the second set of odd samples to produce the other of the I and Q components of the complex signal at one half of the sampling frequency;
   a first digital filter configured to filter the demodulated first set of even samples using a first set of coefficients; and
   a second digital filter configured to filter the demodulated second set of odd samples using a second set of coefficients,
   wherein:
   the output of the first and second digital filters corresponds to a baseband complex signal,
   the first and second filters are finite impulse response (FIR) filters used to implement an N-tap FIR filter, where N is a positive integer, with one of the first and second filters being configured to operate at one half of the sampling frequency on the first set of even samples using even coefficients of the N-tap FIR filter and the other of the first and second filters configured to operate at one half of the sampling frequency on the second set of odd samples using odd coefficients of the N-tap FIR filter, and one of the first and second FIR filters includes a delay is configured to delay the second set of odd samples by one time period of the sampling frequency prior to filtering.

10. The apparatus in claim 9, wherein the demodulated complex signal, prior to filtering, includes images around one half of the sampling frequency.

11. The apparatus in claim 9, wherein the first digital filter is configured to only filter the demodulated first set of even samples using the first set of coefficients and the second digital filter is configured to only filter the demodulated second set of odd samples using the second set of coefficients.

12. A superheterodyne radio receiver including the apparatus in claim 9.

13. The apparatus in claim 9, wherein each of the first and second quadrature demodulators only performs one operation per input sample.

14. The apparatus in claim 9, wherein the first FIR filter includes only about N/2 even coefficients of N-tap FIR filter and the second FIR filter includes only about N/2 odd coefficients of N-tap FIR filter.

15. The apparatus in claim 9, wherein the first and second FIR filters together are implemented with only N multipliers and N−2 adders.

16. The apparatus in claim 9, wherein N is configurable.

17. The apparatus in claim 9, wherein the first and second FIR filters correspond to first and second phases of a polyphase filter and are configured to filter the first and second sets of even and odd samples at the same time.

18. The apparatus in claim 9, wherein the first demodulator is configured to use a cosine signal having a frequency corresponding to the sampling frequency divided by four and the second demodulator is configured to use a sine signal having a frequency corresponding to the sampling frequency divided by four.

19. An integrated demodulator, filter, and decimator for use in a superheterodyne radio receiver chain, where the radio receiver chain includes an analog-to-digital converter for converting an intermediate frequency (IF) signal to a stream of digital samples at a sampling frequency that is four times the IF and a splitter that splits the stream of digital samples into a first set of even samples and a second set of odd samples, the integrated demodulator, filter, and decimator consisting essentially of:

a first quadrature demodulator configured to demodulate the first set of even samples to produce one of a real (I) and imaginary (Q) components of a complex signal at one half of the sampling frequency;

a second quadrature demodulator configured to operate in parallel with the first quadrature demodulator to demodulate the second set of odd samples to produce the other of the I and Q components of the complex signal at one half of the sampling frequency;

a first digital filter configured to filter the demodulated first set of even samples using a first set of coefficients; and a second digital filter configured to filter the demodulated second set of odd samples using a second set of coefficients, wherein:

the output of the first and second digital filters corresponds to a baseband complex signal, the first and second filters are finite impulse response (FIR) filters used to implement an N-tap FIR filter, where N is a positive integer, with one of the first and second filters being configured to operate at one half of the sampling frequency on the first set of even samples using even coefficients of the N-tap FIR filter and the other of the first and second filters configured to operate at one half of the sampling frequency on the second set of odd samples using odd coefficients of the N-tap FIR filter, and one of the first and second FIR filters includes a delay is configured to delay the second set of odd samples by one time period of the sampling frequency prior to filtering.

20. The integrated demodulator, filter, and decimator in claim 19, wherein the demodulated complex signal, prior to filtering, includes images around one half of the sampling frequency.

21. The integrated demodulator, filter, and decimator in claim 19, wherein the integrated demodulator, filter, and decimator is configured to operate at one half of the sampling frequency.

22. The integrated demodulator, filter, and decimator in claim 19, wherein the first quadrature demodulator is configured to demodulate only the first set of even samples and the second quadrature demodulator is configured to demodulate only the second set of odd samples.

23. A superheterodyne radio receiver including the integrated demodulator, filter, and decimator in claim 19.

* * * * *